United States Patent [19]

Noda et al.

[11] Patent Number: 4,820,655

[45] Date of Patent: Apr. 11, 1989

[54] METHOD FOR MANUFACTURING SEMICONDUCTOR OPTICAL INTEGRATED DEVICE WITH OPTICAL WAVEGUIDE REGIONS

[75] Inventors: Yukio Noda; Masatoshi Suzuki; Yukitoshi Kushiro; Shigeyuki Akiba, all of Tokyo, Japan

[73] Assignee: Kokusai Denshin Denwa Kabushiki Kaisha, Tokyo, Japan

[21] Appl. No.: 15,953

[22] Filed: Feb. 18, 1987

[30] Foreign Application Priority Data

Feb. 21, 1986 [JP] Japan .................................. 61-35097

[51] Int. Cl.$^4$ .................. H01L 21/20; H01L 21/203; H01L 21/205
[52] U.S. Cl. ...................................... 437/129; 357/17; 437/126; 372/45; 372/46; 372/50; 372/96; 350/96.11
[58] Field of Search .................. 437/129, 126; 357/17; 372/45, 46, 50, 96; 350/96.11

[56] References Cited

U.S. PATENT DOCUMENTS

| | | | |
|---|---|---|---|
| 4,136,928 | 1/1979 | Logan et al. | 372/50 |
| 4,553,239 | 11/1985 | Akiba et al. | 372/96 |
| 4,573,158 | 2/1986 | Utaka et al. | 372/50 |
| 4,575,851 | 3/1986 | Seki et al. | 372/50 |
| 4,589,117 | 5/1986 | Utaka et al. | 372/96 |
| 4,618,959 | 10/1986 | Mito | 372/96 |
| 4,622,674 | 11/1986 | Mito | 372/45 |
| 4,633,474 | 12/1986 | Akiba et al. | 372/96 |
| 4,648,096 | 3/1987 | Akiba et al. | 372/96 |
| 4,653,058 | 3/1987 | Akiba et al. | 372/96 |
| 4,653,059 | 3/1987 | Akiba et al. | 372/96 |
| 4,665,527 | 5/1987 | Akiba et al. | 372/96 |

FOREIGN PATENT DOCUMENTS

| | | | |
|---|---|---|---|
| 53-3091 | 12/1978 | Japan | 372/50 |
| 2151401 | 7/1985 | United Kingdom | 372/96 |

OTHER PUBLICATIONS

Suematsu et al., "A Multihetero-AlGaAs Laser With Integrated Twin Guide", Proc. IEEE, 1975, 63, p. 208.
Noda et al., "High Power Operation of a Ridge-Waveguide AlGaAs/GaAs Distributed Feedback Laser", Electron Letters, Mar. 1986, vol. 22, No. 6, pp. 310–312.
Suzuki et al., "Dynamic Spectral Width of an InGaAsP-/InP Electroabsorption Light Modulator Under High--Frequency Large-Signal Modulation", Electron Letters, Mar. 1986, vol. 22, No. 6, pp. 312–313.
Utaka et al., "1.5–1.6 μm GaInAsP/InP Integrated Twin-Guide Lasers With First-Order Distributed Bragg Reflectors", Electron Letters, Jun. 1980, vol. 16, No. 12, pp. 455–456.
Abe et al., "GaInAsP/InP Integrated Laser With Butt-Jointed Built-in Distributed-Bragg Reflection Waveguide", Electron Letters, Dec. 1981, vol. 17, No. 25, pp. 945–947.
Suzuki et al., "Monolithic Integration of InGaAsP/InP Distributed-Feedback Laser and Electroabsorption Modulator By Vapor-Phase Epitaxy," OFC/IOOC, 1987, Technical Digest, Reno, Nev., 19–22 Jan. 1987.

Primary Examiner—Brian E. Hearn
Assistant Examiner—M. Wilczewski
Attorney, Agent, or Firm—Emmanuel J. Lobato; Robert E. Burns

[57] ABSTRACT

A method for manufacturing a semiconductor optical integrated device in which a semiconductor element A having an optical waveguide region and a semiconductor element B having another optical waveguide region are integrated on a single substrate. In accordance with the present invention, there is provided steps of growing the optical waveguide region of the semiconductor element A and a protective layer therefor are grown on the entire area of the substrate surface, selectively removing them from the substrate surface in the region to be ultimately occupied by the semiconductor element B, and forming in the region the optical waveguide region of the semiconductor element B through crystal growth.

1 Claim, 4 Drawing Sheets

METHOD FOR MANUFACTURING SEMICONDUCTOR OPTICAL INTEGRATED DEVICE WITH OPTICAL WAVEGUIDE REGIONS

BACKGROUND OF THE INVENTION

The present invention relates to a method for manufacturing a semiconductor optical integrated device of a structure in which optical waveguides are directly interconnected.

In a semiconductor optical integrated device which has a semiconductor laser and a photodetector, optical modulator, or the like directly interconnected, a low-loss optical connection is needed for interconnecting various elements. In particular, what is called direct coupling which directly interconnects optical waveguides is excellent for low-loss, efficient connection of various elements.

However, it is very difficult to manufacture a semiconductor optical integrated device of good reproducibility without abnormal growth nor deterioration of the coupling efficiency between two optical waveguide layers.

SUMMARY OF THE INVENTION

An object of the present invention is to provide a method for manufacturing a semiconductor optical integrated device with an optical waveguide region which neither incurs the above-mentioned abnormal growth nor impairs the coupling efficiency between the A and B optical waveguide layers but ensures good reproducibility.

The present invention for attaining the above object is a method for manufacturing a semiconductor optical integrated device in which a semiconductor element A having an optical waveguide region and a semiconductor element B having another optical waveguide region are integrated on a single substrate, characterized by steps of: growing the optical waveguide region of the semiconductor element A and a protective layer therefor are grown on the entire area of the substrate surface, selectively removing them from the substrate surface in the region to be ultimately occupied by the semiconductor element B, and forming in the region the optical waveguide region of the semiconductor element B through crystal growth.

BRIEF DESCRIPTION OF THE DRAWING

The present invention will be described in detail below in comparison with the accompanying drawing, in which.

DETAILED DESCRIPTION

To make differences between prior art and the present invention clear, prior art will first be described.

Figure 1:
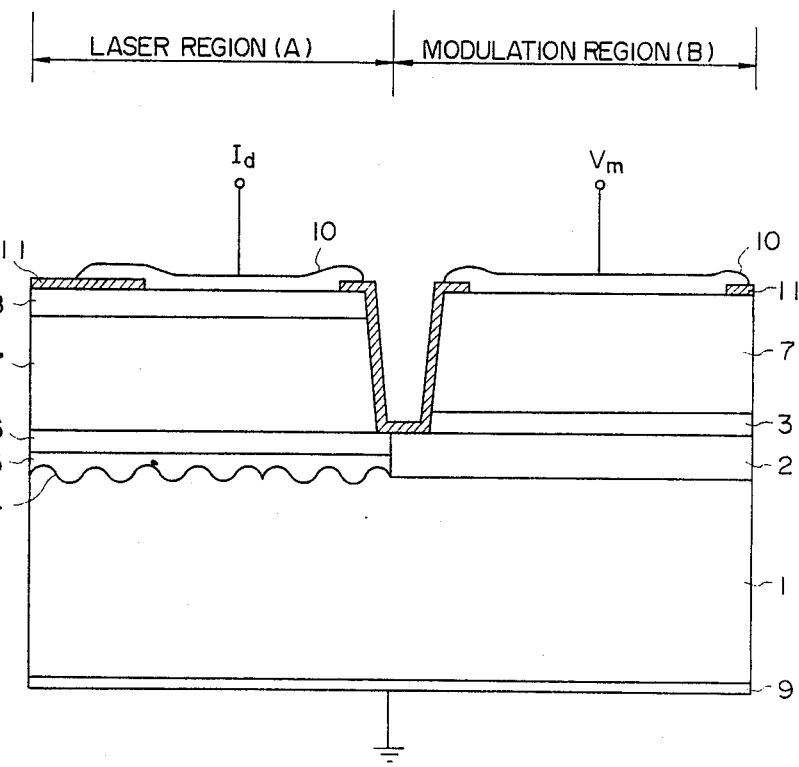
FIG. 1 is a cross-sectional view of a conventional semiconductor optical integrated device including a DFB laser and an optical modulator.
Figure 2A:
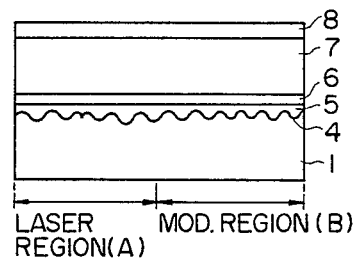
FIG. 2 illustrates, in cross section, a sequence of steps involved in a conventional method for the manufacture of the semiconductor optical integrated device.
Figure 2B:
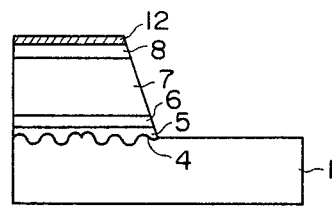
Figure 2C:
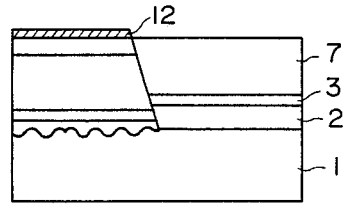
Figure 2D:
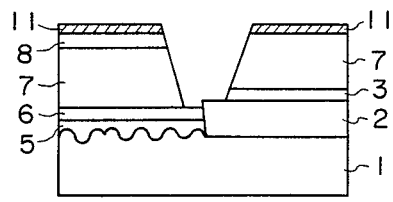
Figure 2E:
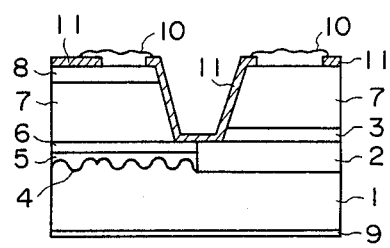

FIG. 1 is a cross-sectional view of a conventional directly-coupled semiconductor optical integrated device, showing an example in which a distributed feedback laser (hereinafter referred to as a "DFB" laser) and an optical modulator are integrated. In FIG. 1, a laser region A has a structure in which an n- or p-type $Ga_pIn_{1-p}As_qP_{1-q}$ laser-region optical waveguide layer 5, an n- or p-type $Ga_rIn_{1-r}As_sP_{1-s}$ active layer 6, a p-type InP upper clad layer 7, and a p-type $Ga_tIn_{1-t}As_uP_{1-u}$ contact layer 8 are formed by crystal growth on an n+-type InP substrate 1. Reference numeral 4 indicates a λ/4 shift-diffraction grating, 9 and 10 electrodes, and 11 an $Si_3N_4$ insulating film.

On the other hand, a modulation region B has a structure in which an n−-type $Ga_xIn_{1-x}As_yP_{1-y}$ modulation-region optical waveguide layer 2 (hereinafter referred to as a "B optical waveguide layer 2"), an n−-type InP layer 3, and a p-type InP layer 7 are formed by crystal growth on the same substrate 1 in a manner to include the GaInAsP layer-region optical waveguide layer 5 (hereinafter referred to as an "A optical waveguide layer 5") and the active layer 6 (In the following the layers 5 and 6 will be referred to as an "optical waveguide region"), and the modulation region has the electrodes 9 and 10 and the $Si_3N_4$ insulating film 11, as is the case with the laser region A. The energy gap of the B optical waveguide layer 2 is set to a little greater than photon energy with a view to produce an electroabsorption effect. By applying a reverse voltage across the electrodes 9 and 10, the absorption end of the B optical waveguide layer 2 shifts toward the long-wavelength side, permitting intensity modulation of light.

To perform this, the compositions of the respective layers are selected to satisfy the condition $0 \leq x, y, p, q, r, s \leq 1$.

Furthermore, the above optical integrated device usually has a window structure (not shown) at either end for suppressing light returning therefrom to the laser region A.

FIG. 2 shows a sequence of steps involved in the manufacture of the conventional optical integrated device. The steps are as follows:

(a) The diffraction grating 4 is formed on the substrate 1 throughout the laser region A and the modulation region B, after which the A optical waveguide layer 5, the active layer 6, the p-type InP layer 7, and the contact layer 8 are formed in succession through epitaxial growth.

(b) An $Si_3N_4$ film 12 is deposited all over the surface of the contact layer 8 through, for instance, a plasma CVD process, and the $Si_3N_4$ film 12 in the modulation region B and a part of the laser region A is removed by ordinary photolithography and etching techniques, obtaining a pattern. After this, the layers 8, 7, 6 and 5 and the diffraction grating 4 in the modulation region B are selectively removed aslant by a wet etching method through the remaining $Si_3N_4$ film 12 used as a mask.

(c) Next, the B optical waveguide layer 2, the n−-type InP layer 3, and the p-type InP upper clad layer 7 are formed in the modulation region B.

(d) After removing the $Si_3N_4$ film 12 in the laser region A, the $Si_3N^4$ film 11 is deposited again on the surfaces of the contact layer 8 of the laser region A and the p-type InP layer 7 of the modulation region B. Then the layers 8 and 7 are selectively etched away in a V-letter shape, using the $Si_3N_4$ film 11 as a mask.

(e) Finally, the $Si_3N_4$ film 11 is deposited all over the surfaces of the layers 8 and 7 and is selectively removed to form windows for electrodes, followed by the deposition of the electrodes 9 and 10.

With the above steps, the semiconductor optical integrated device can be fabricated.

Figure 3:
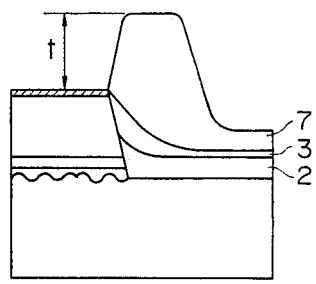
FIG. 3 is a diagram illustrating a step in the conventional method.
Figure 4A:
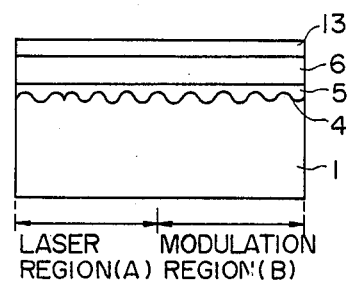
FIG. 4 illustrates, in cross section, a sequence of steps involved in the manufacturing method of the present invention.
Figure 4B:
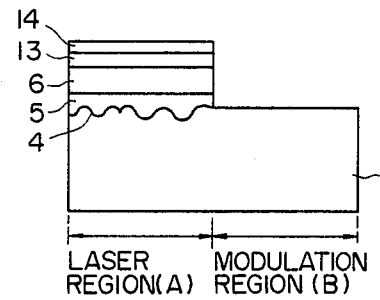
Figure 4C:
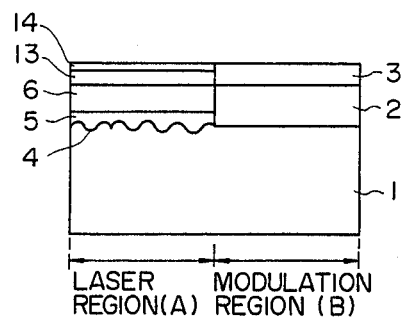
Figure 4D:
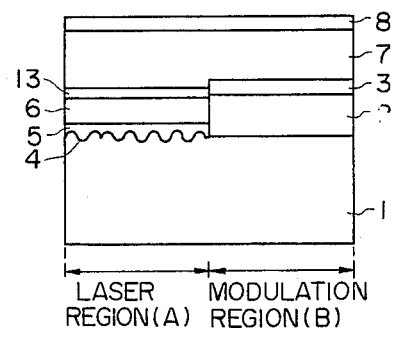
Figure 4E:
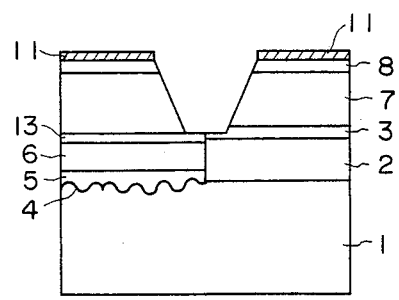
Figure 4F:
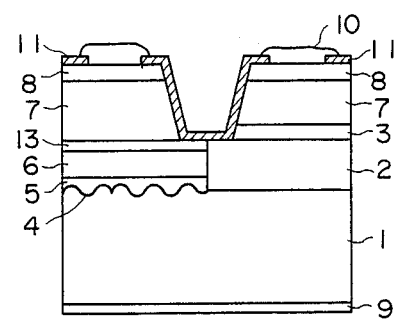

In the above-mentioned step (c), however, crystal growth of a uniform layer structure is extremely difficult; in practice, the layers 2, 3 and 7 are abnormally grown, as depicted in FIG. 3. This abnormal growth is a frequent phenomenon in the vapor phase epitaxy. In some cases, the layers 2 and 3 may be deposited on the slope of the laser region A, or the layer 7 may form a projection as wide as several tens of micromillimeters and its height t may reach around 10 micromillimeters. Such an abnormal growth presents a problem as it degrades the coupling efficiency between the A optical waveguide layer of the laser region A and the B optical waveguide layer of the modulation region B or it makes it impossible to proceed to the subsequent manufacturing steps. If the step (b) and the subsequent steps were carried out after the growth of the active layer 6 of the laser region A, the active layer would be impaired, making the stable single-wave oscillation impossible.

Therefore, it is very difficult to manufacture a semiconductor optical integrated device of good reproducibility without the abovementioned abnormal growth nor deterioration of the coupling efficiency between the A optical waveguide layer and the B optical waveguide layer.

With reference to the accompanying drawings, the present invention will hereinafter be described in detail.

FIG. 4 illustrates a sequence of steps involved in the manufacturing method of the present invention, which will be described in connection with an optical integrated device including a DFB laser and an optical modulator in combination.

(1) First Step (1) The A optical waveguide layer 5, the active layer 6 (In the following, the layers 5 and 6 will be referred to as "an optical waveguide region".) and an InP protective layer 13 are grown on the substrate 1 in both the laser region A and the modulation region B. Reference numeral 4 indicates a λ/4 shift-diffraction grating provided on the substrate 1.

(2) An Si$_3$N$_4$ film 14 is deposited all over the surface of the protective layer 13 through, for example, a plasma CVD method and is selectively removed from the region B through ordinary photolithography and etching techniques. After this, the layers 13, 6, 5 and 4 in the region B are removed in succession using the Si$_3$N$_4$ film 14 as a selective etching mask.

(2) Second Step (3) The B optical waveguide layer 2 is grown in the region B so that it directly joins the optical waveguide region of the laser region A, followed by the growth of the n$^-$-type InP layer 3 whose energy gap is greater than that of the B optical waveguide layer 2.

(3) Third Step (4) The Si$_3$N$_4$ film 14 is removed, and the p-type InP upper clad layer 7 and the contact layer 8 are formed by crystal growth in both regions. In the prior art example the contact layer 8 is not grown in the modulation region B, but in the present invention it can easily be grown. This allows ease in obtaining ohmic contact with the electrodes.

(5) Next, the Si$_3$N$_4$ film 11 is deposited over the entire area of the surface of the contact layer 8 and is then selectively removed, after which the layers 8 and 7 are selectively etched away in a V-letter shape, using the Si$_3$N$_4$ film 11 as a mask.

(6) Finally, the Si$_3$N$_4$ film 11 is deposited all over the surfaces of the contact layer 8 and the upper clad layer 7 and is partly removed to form windows for electrodes, and then the electrodes 9 and 10 are provided.

With the above steps, the semiconductor optical integrated device shown in FIG. 1 can be fabricated without suffering the aforementioned abnormal growth.

While in the above the device having the DFB laser and the optical modulator integrated with each other has been exemplified as a semiconductor optical integrated device with optical waveguide regions, the present invention is applicable to a variety of semiconductor optical integrated devices which employs, in each combination, a laser element and an external waveguide, a laser and a monitoring photodetector, an empilfier and an external waveguide, a multiplication of optical space switches, and so forth. Moreover, the present invention is not limited specifically to the materials of the InP/InGaAsP system but may be applied as well to other semiconductor materials of the GaAs/GaAlAs system, InP/AlGaInAs system, GaSb/InAsPSb system, GaSb/AlGaAsSb system, etc. When no laser element is used, the active layer 6 is left out and the protective layer 13 is formed adjacent the optical waveguide layer 5.

As described above, the present invention includes a manufacturing steps of growing a protecting film on the optical waveguide layer of one of two semiconductor elements and then growing the optical waveguide region of the other semiconductor element. This prevents the afore-mentioned abnormal growth and permits the fabrication of the semiconductor optical integrated device with good reproducibility and without degrading the coupling efficiency between the both optical waveguide regions. Accordingly, the present invention is of great utility in practical use.

What we claim is:

1. A method for manufacturing a semiconductor optical integrated device with optical wavelength regions in which a first semiconductor element region including a first optical waveguide region and a second semiconductor element region including a second optical waveguide region are integrated on a single substrate, characterized by:

a first step in which at least one layer for providing the first optical waveguide of the first semiconductor element region and a protective layer therefor are formed over an entire area of a predetermined region on the substrate which includes the first and second semiconductor element regions, and then the at least one layer and the protective layer are removed from the region which will ultimately constitute the second semiconductor element region;

a second step in which the second optical waveguide region and a semiconductor layer of an energy gap greater than that of the second semiconductor optical waveguide region are formed on the region from which the at least one layer and the protective layer have been removed;

a third step in which at least a clad layer is formed on the protective layer of the first semiconductor element region and the semiconductor layer of the second semiconductor element region;

a fourth step in a which a film of silicon nitride is deposited over the entire area of the contact layer and then selectively removed after which the contact layer and clad layer are etched away in a V-shape groove using the film of silicon nitride as a mask; and a fifth step in which the silcon nitride film is deposited all over surfaces of the contact layer and upper clad layer and is partly removed to form windows for electrodes, and then electrically separated electrodes are provided.

* * * * *